United States Patent
Tsuchiya et al.

(10) Patent No.: US 10,651,096 B2
(45) Date of Patent: May 12, 2020

(54) SEMICONDUCTOR DEVICE AND METHOD FOR MANUFACTURING SAME

(71) Applicant: Mitsubishi Electric Corporation, Tokyo (JP)

(72) Inventors: Noriaki Tsuchiya, Tokyo (JP); Yosuke Setoguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/093,660

(22) PCT Filed: Aug. 9, 2016

(86) PCT No.: PCT/JP2016/073451
§ 371 (c)(1),
(2) Date: Oct. 15, 2018

(87) PCT Pub. No.: WO2018/029786
PCT Pub. Date: Feb. 15, 2018

(65) Prior Publication Data
US 2019/0172757 A1 Jun. 6, 2019

(51) Int. Cl.
*H01L 21/66* (2006.01)
*H01L 29/06* (2006.01)
(Continued)

(52) U.S. Cl.
CPC ......... *H01L 22/12* (2013.01); *G01N 21/9501* (2013.01); *G01N 21/956* (2013.01);
(Continued)

(58) Field of Classification Search
CPC . H01L 22/12; H01L 23/544; H01L 21/02271; H01L 21/02529; H01L 21/0262;
(Continued)

(56) References Cited

U.S. PATENT DOCUMENTS

2010/0148244 A1  6/2010  Kitabatake et al.
2013/0270576 A1* 10/2013  Masuda ............... H01L 29/045
                                                  257/77

FOREIGN PATENT DOCUMENTS

JP   2013-219293 A   10/2013
JP   2015-190826 A   11/2015
WO   2007/013377 A1   2/2007

OTHER PUBLICATIONS

International Search Report issued in PCT/JP2016/073451; dated Nov. 15, 2016.
(Continued)

*Primary Examiner* — Tong-Ho Kim
(74) *Attorney, Agent, or Firm* — Studebaker & Brackett PC

(57) ABSTRACT

A method for manufacturing a semiconductor device according to the present invention includes a manufacturing step of forming a plurality of unit regions each having a plurality of first regions serving as effective cells in which main current flows, and a second region that has an appearance different from that of the first regions and serves as an ineffective cell in which no main current flows, and an appearance inspection step including a step of imaging the unit region to obtain a captured image, a step of cutting out an inspection image from the captured image based on a position of an alignment pattern containing the second region, and a step of comparing the inspection image with a reference image.

14 Claims, 13 Drawing Sheets

(51) Int. Cl.
| | |
|---|---|
| H01L 29/16 | (2006.01) |
| H01L 23/544 | (2006.01) |
| G01N 21/95 | (2006.01) |
| G01N 21/956 | (2006.01) |
| H01L 29/78 | (2006.01) |
| H01L 21/02 | (2006.01) |
| H01L 21/027 | (2006.01) |
| H01L 21/04 | (2006.01) |
| H01L 29/04 | (2006.01) |
| H01L 29/10 | (2006.01) |
| H01L 29/167 | (2006.01) |
| H01L 29/20 | (2006.01) |
| H01L 29/36 | (2006.01) |
| H01L 29/417 | (2006.01) |
| H01L 29/45 | (2006.01) |
| H01L 29/49 | (2006.01) |
| H01L 29/66 | (2006.01) |
| H01L 29/739 | (2006.01) |

(52) U.S. Cl.
CPC ........ *H01L 23/544* (2013.01); *H01L 29/0696* (2013.01); *H01L 29/1608* (2013.01); *H01L 29/78* (2013.01); *H01L 21/0262* (2013.01); *H01L 21/0273* (2013.01); *H01L 21/02271* (2013.01); *H01L 21/02529* (2013.01); *H01L 21/049* (2013.01); *H01L 21/0465* (2013.01); *H01L 29/045* (2013.01); *H01L 29/1095* (2013.01); *H01L 29/1602* (2013.01); *H01L 29/167* (2013.01); *H01L 29/2003* (2013.01); *H01L 29/36* (2013.01); *H01L 29/41741* (2013.01); *H01L 29/45* (2013.01); *H01L 29/4916* (2013.01); *H01L 29/66068* (2013.01); *H01L 29/7395* (2013.01); *H01L 29/7802* (2013.01); *H01L 2223/5442* (2013.01); *H01L 2223/54426* (2013.01)

(58) Field of Classification Search
CPC ............. H01L 21/0273; H01L 21/0465; H01L 21/049; H01L 29/045; H01L 29/1095; H01L 29/1602; H01L 29/167; H01L 29/2003; H01L 29/36; H01L 29/41741; H01L 29/45; H01L 29/4916; H01L 29/66068; H01L 29/7395; H01L 29/7802; H01L 2223/5442; H01L 2223/54426; G01N 21/9501; G01N 21/956
USPC .......................................................... 257/77
See application file for complete search history.

(56) References Cited

OTHER PUBLICATIONS

Written Opinion issued in PCT/JP2016/073451; dated Nov. 15, 2016.
Notification of Transmittal of the International Search Report and the Written Opinion of the International Searching Authority, or the Declaration issued in PCT/JP2016/073451; dated Nov. 15, 2016.

* cited by examiner

SEMICONDUCTOR DEVICE AND METHOD FOR MANUFACTURING SAME

FIELD

The present invention relates to a semiconductor device and a method for manufacturing the same.

BACKGROUND

PTL 1 discloses an inspection device used for appearance inspection. This inspection device has a mark board. The mark board is provided with an alignment mark on a surface thereof. The alignment mark is provided at a position corresponding to an imaging position of a substrate in appearance inspection. An inspection image of a desired inspection site is cut out from a captured image of the substrate with reference to the position of the alignment mark on the mark board. By comparing the cut-out inspection image and a reference image, accurate appearance inspection can be performed.

CITATION LIST

Patent Literature

[PTL 1] JP 2015-190826 A

SUMMARY

Technical Problem

Generally, in appearance inspection, an appearance inspection device sequentially images chips formed on a wafer. Here, when the size of a chip is larger than the visual field size of a camera, the chip is divided into plural FOVs (Field of View) and imaged. However, an error may occur in the imaging position of the appearance inspection device. When an error occurs in the imaging position, a positional displacement occurs between the inspection image and the reference image to be compared with each other. At this time, there may occur an artificial defect in which a place which is not defective is determined to be abnormal. Furthermore, the detection precision for a pattern shape to be detected as a defect, foreign matters, etc. is lowered.

It is conceivable as a countermeasure to the error of the imaging position that an alignment mark is provided for each FOV. In this case, in an appearance inspection step, an FOV containing an alignment pattern is first imaged. Next, in-FOV alignment is performed. In the in-FOV alignment, a captured image is trimmed based on position information of the alignment pattern. As a result, an inspection image at an accurate position can be obtained. Next, a defect is detected by comparing the trimmed inspection image with the reference image.

However, there is a case where a characteristic pattern used as an alignment pattern is not contained in all FOVs. There is considered, for example, a case where a part of a planar layout in which unit cells such as MOSFETs (Metal-Oxide-Semiconductor Field-Effect Transistors) or IGBTs (Insulated Gate Bipolar Transistors) are periodically arranged is an FOV. Even when a specific unit cell is registered as an alignment pattern in the appearance inspection device, it is difficult to distinguish the alignment pattern from plural unit cells in the captured image.

Accordingly, in the in-FOV alignment, an error may occur in a position where inspection image is cut out. At this time, an error occurs in the position of a detected defect. Furthermore, in consideration of the error of the cut-out position of the inspection image, a region which the fields of view of the camera overlaps is required to be large. However, when the region which the fields of view of the camera overlaps is set to be large, the number of FOVs increases. Accordingly, the setting of the appearance inspection device is complicated. Also, an inspection time is longer.

The present invention has been made to solve the above problems, and an object of the present invention is to obtain a semiconductor device capable of performing accurate appearance inspection, and a method for manufacturing the same.

Solution to Problem

A method for manufacturing a semiconductor device according to the present invention includes a manufacturing step of forming a plurality of unit regions each having a plurality of first regions serving as effective cells in which main current flows, and a second region that has an appearance different from that of the first regions and serves as an ineffective cell in which no main current flows, and an appearance inspection step including a step of imaging the unit region to obtain a captured image, a step of cutting out an inspection image from the captured image based on a position of an alignment pattern containing the second region, and a step of comparing the inspection image with a reference image.

A semiconductor device according to the present invention includes a plurality of unit regions each having a plurality of effective cells in which main current flows, and an ineffective cell that has an appearance different from that of the effective cells and in which no main current flows, wherein the plurality of unit regions have a width of 500 μm to 5000 μm.

Advantageous Effects of Invention

In a method for manufacturing a semiconductor device according to the present invention, a second region serving as an ineffective cell is used as an alignment pattern. By providing the second region for each unit region which is an imaging range, an inspection image at an accurate position can be obtained. Accordingly, accurate appearance inspection can be performed.

A semiconductor device according to the present invention includes an ineffective cell for each unit region serving as an imaging range. By using, as an alignment pattern, a region which serves as an ineffective cell, an inspection image at an accurate position can be obtained. Therefore, accurate appearance inspection can be performed.

DESCRIPTION OF EMBODIMENTS

Figure 1:
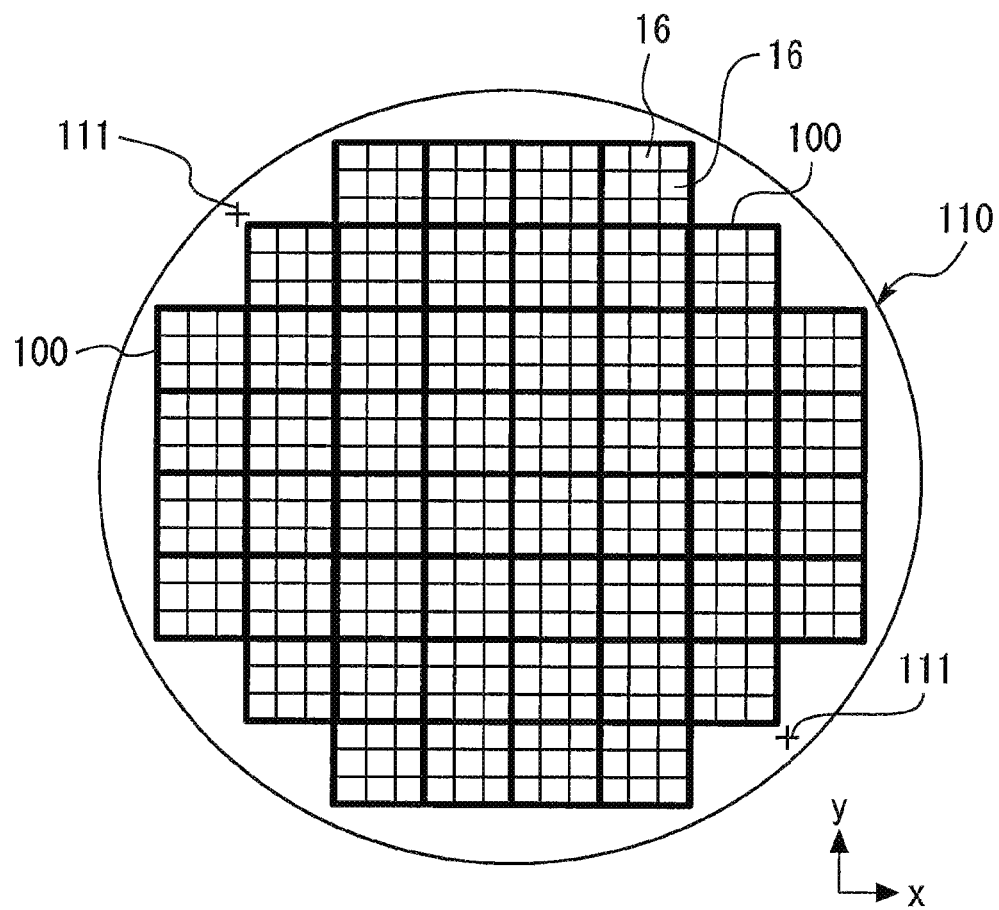
FIG. 1 is a plan view of a semiconductor device according to a first embodiment.

A semiconductor device and a method for manufacturing the same according to an embodiment of be present invention are described with reference to drawings. Identical or corresponding constitutional elements are given the same reference numerals, and the repeated description of such constitutional elements may be omitted.

First Embodiment

FIG. 1 is a plan view of a semiconductor device according to a first embodiment. Plural semiconductor devices 100 are formed on a wafer 110. In addition, global alignment marks 111 are provided on a peripheral portion of the wafer 110.

The global alignment marks 111 are used for aligning the wafer 110 when appearance inspection is performed. Furthermore, in the present embodiment, one semiconductor device 100 is divided into nine unit regions 16.

Figure 2:
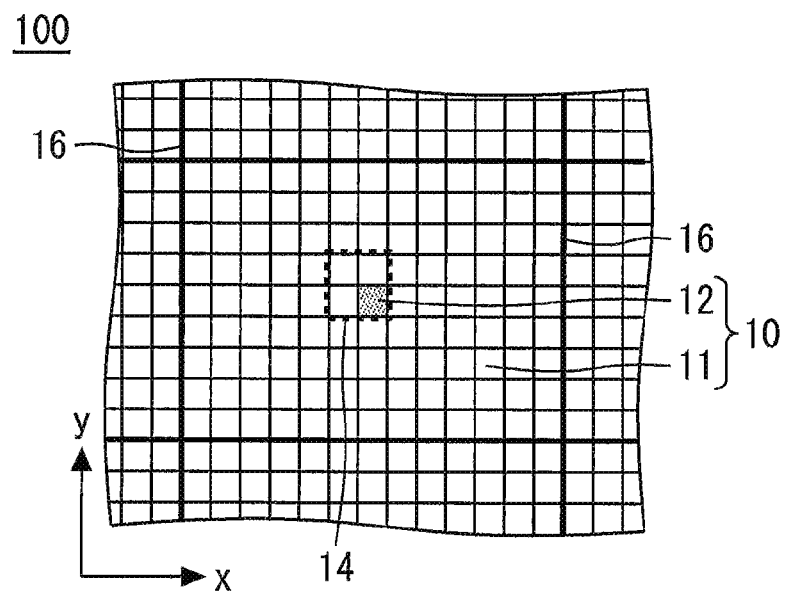
FIG. 2 is a plan view of a semiconductor device according to the first embodiment.

FIG. 2 is an enlarged view of one unit region 16 and the periphery thereof. The semiconductor device 100 according to the present embodiment includes plural unit cells 10. The plural unit cells 10 are arranged on an x-y plane. In the x-y plan view, all the unit cells 10 are squares of equal size.

The unit cell 10 includes an effective cell 11 and an ineffective cell 12. The effective cell 11 is a cell through which main current flows. Furthermore, in the present embodiment, the effective cell 11 is a vertical type MOSFET using silicon carbide. Furthermore, the ineffective cell 12 is a cell which is electrically insulated and through which no main current flows.

The semiconductor device 100 is divided into plural unit regions 16. Each unit region 16 has plural effective cells 11 and one ineffective cell 12. In the appearance inspection, there is a case where a semiconductor device as an inspection target is larger than the visual field range of a camera used for imaging. In this case, the semiconductor device is divided into plural unit regions, and imaged. The unit region 16 is also referred to as FOV. In the present embodiment, a region where 13 unit cells 10 are arranged in an x direction and nine unit cells 10 are arranged in a y direction corresponds to one unit region 16. The unit region 16 includes 116 effective cells 11, and one ineffective cell 12. The ineffective cell 12 is arranged at the center of the unit region 16.

The semiconductor device 100 is divided into plural unit regions 16. The respective unit regions 16 have the same structure. Therefore, the semiconductor device 100 has a planar layout in which the effective cell 11 and the ineffective cell 12 are periodically arranged. The unit region 16 has a width of 500 μm to 5000 μm in the x direction and the y direction. Accordingly, the ineffective cells 12 are arranged at intervals of 500 μm to 5000 μm.

The unit region 16 has an alignment pattern 14. The alignment pattern 14 serves as a reference position in appearance inspection. The alignment pattern 14 is formed from four unit cells 10 including one ineffective cell 12. The alignment pattern 14 is square and includes the ineffective cell 12 at a lower right portion.

Figure 3:
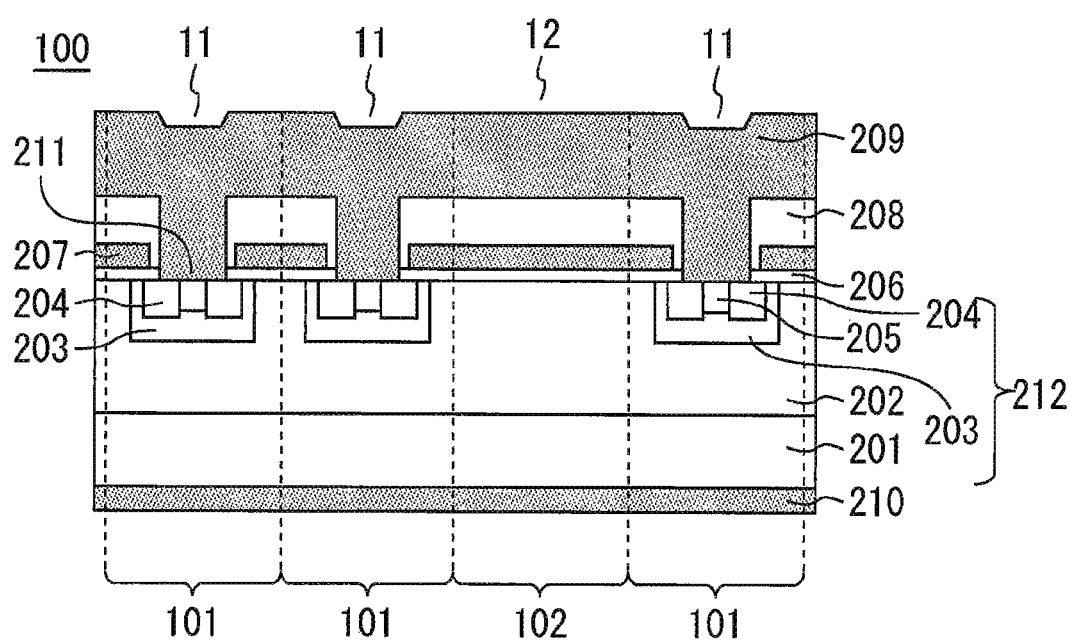
FIG. 3 is a cross-sectional view of the semiconductor device according to the first embodiment.

FIG. 3 is a cross-sectional view of the semiconductor device according to the first embodiment. The unit region 16 has a first region 101 and a second region 102. The first region 101 is a region where the effective cell 11 is formed. The second region 102 is a region where the ineffective cell 12 is formed. The semiconductor device 100 includes a substrate 201. The substrate 201 is formed of silicon carbide. In the present embodiment, silicon carbide having a 4H poly-type is used. The substrate 201 is of an n-type and has low resistance. Furthermore, the upper surface of the substrate 201 is inclined by 4° from a (0001) plane. A drift layer 202 formed of n-type silicon carbide is provided on the upper surface of the substrate 201.

In the first region 101, a p-type well 203 is provided on the upper surface side of the drift layer 202. The well 203 contains aluminum as p-type impurities. Furthermore, an n-type source 204 is provided on the upper surface side of the well 203. A source 204 contains nitrogen as n-type impurities. The source 204 is provided in the well 203 so as to be shallower than the well 203.

A well contact region 205 is provided at the central portion of the source 204 on the upper surface side of the well 203. The well contact region 205 contains aluminum as p-type impurities. The well 203 and the well contact region 205 are short-circuited to each other. In addition, the well contact region 205 is provided to be shallower than the source 204. The substrate 201, the drift layer 202, the well 203, the source 204, and the well contact region 205 constitute a semiconductor layer 212.

Furthermore, a gate insulating film 206 is provided on the upper surface of the drift layer 202. The gate insulating film 206 is formed of silicon oxide. A gate electrode 207 is provided on the gate insulating film 206 across the adjacent first regions 101. An interlayer insulating film 208 is provided on the gate electrode 207. An opening 211 for exposing the source 204 and the well contact region 205 therethrough is provided to the gate insulating film 206 and the interlayer insulating film 208.

A source electrode 209 is provided on the interlayer insulating film 208 so as to be filled in the opening 211. The source electrode 209 is in contact with the source 204 and the well contact region 205 at the opening 211. A drain electrode 210 is provided on the back surface of the substrate 201. From the above configuration, MOSFET as an effective cell 11 formed in the first region 101. The effective cell 11 is a cell through which main current flows in the semiconductor layer 212. Furthermore, the effective cell 11 is a cell which forms a channel therein and can be switched. On the other hand, in the ineffective cell 12, the semiconductor layer 212 is covered with the gate insulating film 206. Therefore, no channel is formed in the ineffective cell 12.

Figure 4:
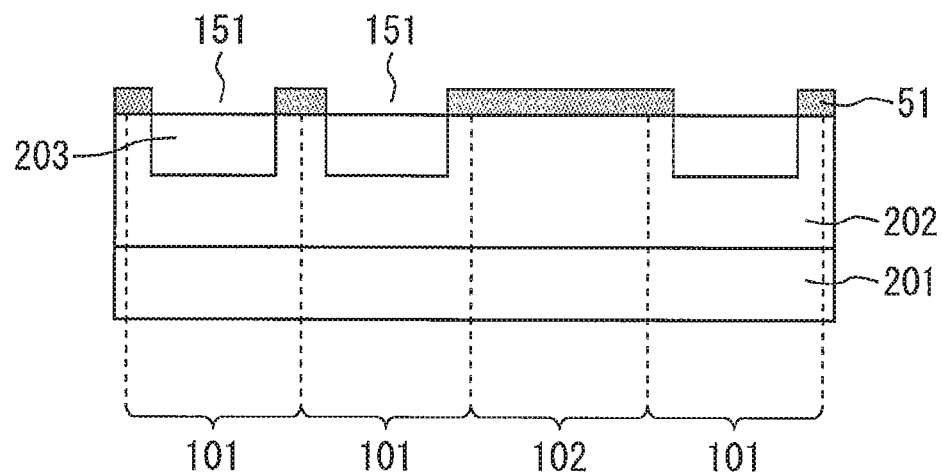
FIG. 4 is a cross-sectional view showing the method for manufacturing the semiconductor device according to the first embodiment.

Next, a method for manufacturing the semiconductor device 100 will be described. FIG. 4 is a cross-sectional view showing the method for manufacturing the semiconductor device according to the first embodiment. First, the drift layer 202 is epitaxially grown on the substrate 201. The drift layer 202 is formed by a CVD (Chemical Vapor Deposition) method. Furthermore, the drift layer 202 contains n-type impurities having a concentration of $1\times10^{15}$ to $1\times10^{17}$ cm$^{-1}$. The thickness of the drift layer 202 ranges from 5 to 100 μm. As described above, the upper surface of the substrate 201 is inclined by 4° from a (0001) plane. Therefore, the drift layer 202 having few crystal defects can be formed.

Next, a first implantation mask 51 is formed on the drift layer 202. Next, a first opening 151 is formed in the first implantation mask 51. The first opening 15 is formed by using a photoresist. The first opening 151 is formed on each of the first regions 101. Furthermore, the first opening 151 exposes the drift layer 202. The second region 102 is held while covered with the first implantation mask 51. Here, the first implantation mask 51 is an insulating layer. Furthermore, the step of forming the first opening 151 in the first implantation mask 51 is referred to as a first opening step.

Next, aluminum ions as p-type impurities are implanted into the drift layer 202 from the first opening 151. At this time, the implantation depth of the aluminum ions is set in the range from 0.5 to 3 μm which does not exceed the thickness of the drift layer 202. The impurity concentration of the ion-implanted aluminum is set in the range from $1\times10^{11}$ to $1\times10^{19}$ cm$^{-3}$ which is higher than the n-type impurity concentration of the drift layer 202. From the above step, wells 203 are formed.

Figure 5:
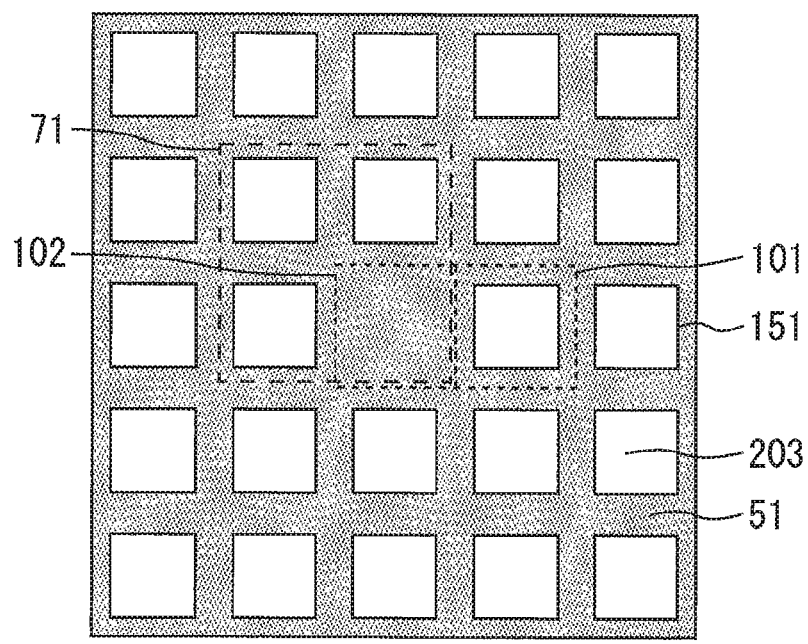
FIG. 5 is a plan view showing the method for manufacturing the semiconductor device according to the first embodiment.

Next, an appearance inspection step is carried out. FIG. 5 is a plan view of FIG. 4. The first opening 151 is provided in the first implantation mask 51 on the first region 101. Therefore, the well 203 is exposed in the first region 101. On the other hand, the second region 102 is covered with the first implantation mask 51. Accordingly, the first region 101 and the second region 102 have different appearances. Therefore, a region containing the second region 102 can be used as an alignment pattern 71. The alignment pattern 71 is composed of three first regions 101 and one second region 102. The alignment pattern 71 is square, and the lower right portion thereof is the second region 102.

In the appearance inspection step, the wafer 110 is first set on a stage of the appearance inspection device. Thereafter, the camera equipped to the appearance inspection device images and detects the global alignment marks 111. Based on this result, the appearance inspection device performs positional correction on the wafer 110. Next, the semiconductor device 100 formed on the wafer 110 are successively imaged by the camera equipped to the appearance inspection device.

The semiconductor device 100 is imaged while divided into plural FOVs. Here, the FOV corresponds to the unit region 16. An error of 0.1 μm to several tens μm in may occur in a moving mechanism of the appearance inspection device. Therefore, when a chip is imaged while divided into plural FOVs, a place which cannot be imaged by the camera may occur in the chip. In order to prevent this, a region where the fields of view of the camera overlap each other is set in the range from 0.1 μm to several tens μm. Accordingly, during imaging, a region which is broader than the unit region 16 by 0.1 μm to several tens μm is imaged. From the above step, a captured image is obtained.

Next, in-FOV alignment is performed. Taking an error of the imaging position into consideration, a captured image contains an image whose range is broader than a region used for inspection. In the in-FOV alignment, an inspection image is cut out from the captured image based on the position of the alignment pattern 71. The inspection image is an image of a region used for inspection. Next, the inspection image is compared with a reference image to detect a defect. Here, the reference image is an image of a unit region 16 in a state of having no defect. A portion in the inspection image which is different from the reference image is detected as a defect.

In the appearance inspection step, process defects occurring in a manufacturing process are detected from the inspection image. The process defects are, for example, abnormality in pattern shape, adhesion of foreign matter, scratch and chipping. Furthermore, in the present embodiment, the semiconductor layer 212 contains silicon carbide which is a wide bandgap semiconductor. Therefore, the presence or absence of crystal defects of the wide bandgap semiconductor is also detected in the appearance inspection. Sizes of about several μm exist as the sizes of the process defects and the crystal defects. Therefore, the magnification of an objective lens of the camera is adjusted so that defects of several um or less can be detected. Note that the appearance inspection step may be performed before ion implantation is performed from the first opening 151. Next, the first implantation mask 51 is removed.

Figure 6:
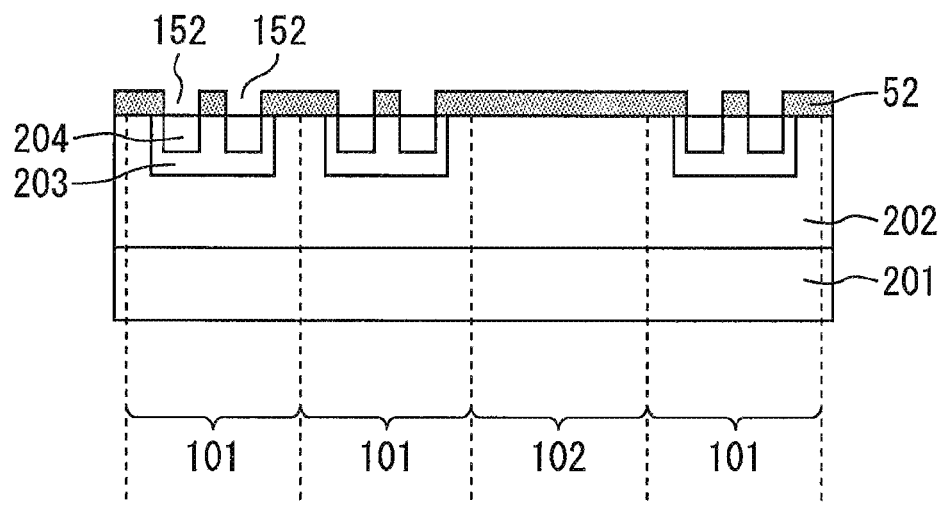
FIG. 6 is a cross-sectional view showing the method for manufacturing the semiconductor device according to the first embodiment.

Next, as shown in FIG. 6, a second implantation mask 52 is formed on the drift layer 202. Next, a first opening 152 is formed in the second implantation mask 52. The first opening 152 is formed on each of the first regions 101. Furthermore, the first opening 152 is formed inside each of the wells 203 to expose the well 203. In addition, the first opening 152 is formed while the second implantation mask 52 is left at the center portion of the well 203. Furthermore, the second region 102 is kept to be covered with the second implantation mask 52. Here, the second implantation mask 52 is an insulating layer. The step of forming the first opening 152 in the second implantation mask 52 will be referred to as the first opening step.

Next, nitrogen ions as n-type impurities are implanted into the well 203 from the first opening 152. At this time, nitrogen ions are implanted more shallowly as compared with the well 203. In addition, the impurity concentration of ion-implanted nitrogen is set in the range from $1\times10^{18}$ to $1\times10^{21}$ which is higher than the p-type impurity concentration of the well 203. From the above step, the source 204 is formed.

Figure 7:
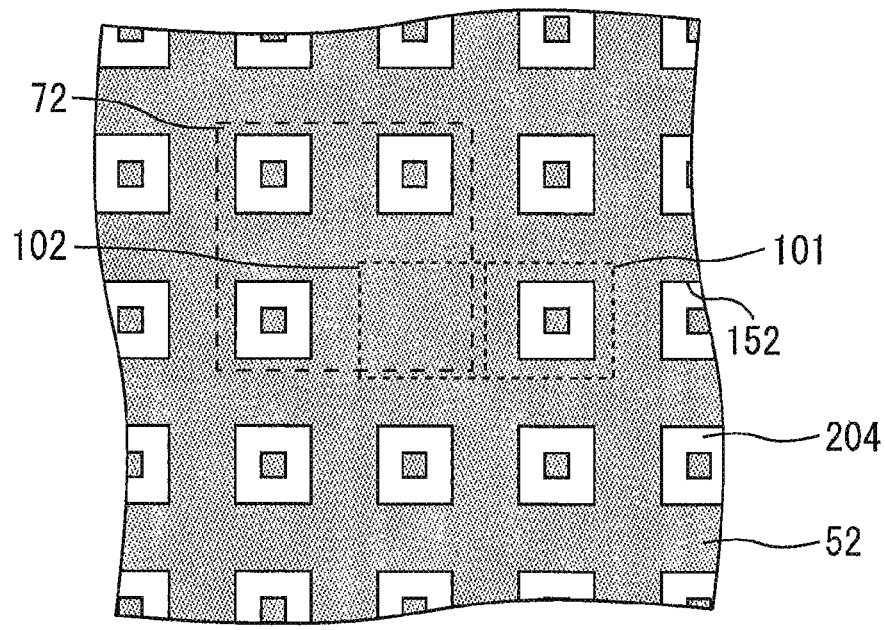
FIG. 7 is a plan view showing the method for manufacturing the semiconductor device according to the first embodiment.

Next, the appearance inspection step is carried out. FIG. 7 is a plan view of FIG. 6. The first opening 152 is provided in the second implantation mask 52 on the first region 101. Therefore, the source 204 is exposed in the first region 101. On the other hand, the second region 102 is covered with the second implantation mask 52. Accordingly, the first region 101 and the second region 102 have different appearances.

Therefore, a region containing the second region 102 can be used as an alignment pattern 72. The procedure of the appearance inspection step is the same as the procedure described with reference to FIG. 5 except that the alignment pattern 71 is replaced by the alignment pattern 72. Note that the appearance inspection step may be performed before the ion implantation from the first opening 152 is carried out. Next, the second implantation mask 52 is removed.

Figure 8:
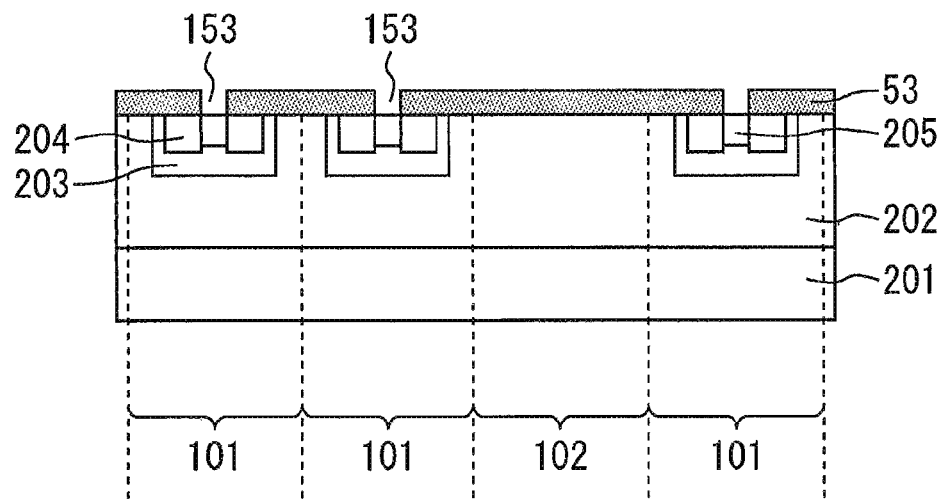
FIG. 8 is a cross-sectional view showing the method for manufacturing the semiconductor device according to the first embodiment.

Next, as shown in FIG. 8, a third implantation mask 53 is formed on the drift layer 202. Next, a first opening 153 is formed in the third implantation mask 53. The first opening 153 is formed by using a photoresist. The first opening 153 is formed on each of the first regions 101. In addition, the first opening 153 is surrounded by the source 204 at the central portion of the well 203, and is formed so as to expose a region where nitrogen ions are not implanted. In addition, the second region 102 is kept to be covered with the third implantation mask 53. Here, the third implantation mask 53 is an insulating layer. The step of forming the first opening 153 in the third implantation mask 53 is referred to as the first opening step.

Next, aluminum ions as p-type impurities are implanted into the well 203 from the first opening 153. At this time, the impurity concentration of the ion-implanted aluminum is set to be higher than the p-type impurity concentration of the well 203. From the above step, the well contact region 205 is formed. Furthermore, it is preferable that the substrate 201 is heated to 150° C. or more and subjected to ion implantation, whereby the resistance of the well contact region 205 can be reduced.

Figure 9:
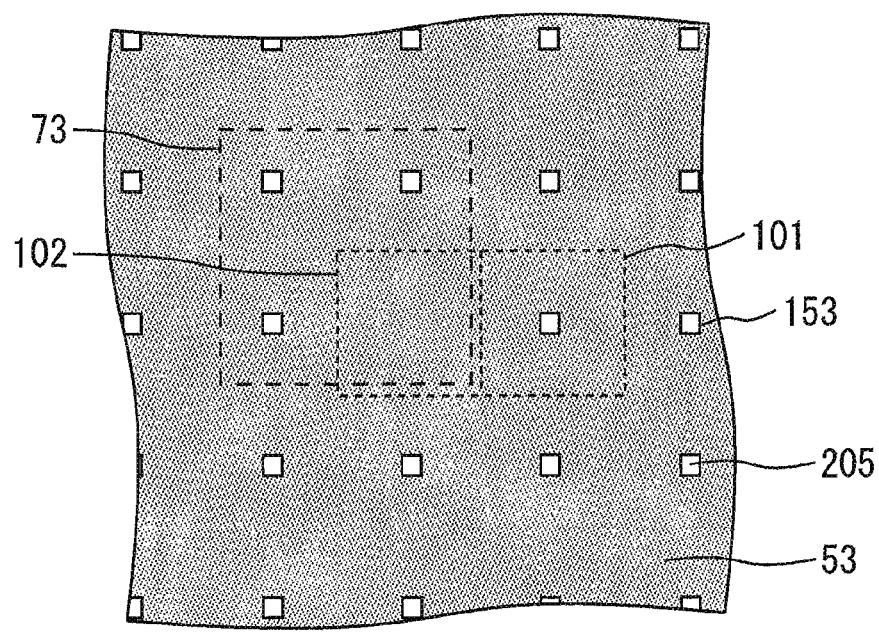
FIG. 9 is a plan view showing the method for manufacturing the semiconductor device according to the first embodiment.

Next, the appearance inspection step is carried out. FIG. 9 is a plan view of FIG. 8. The first opening 153 is provided in the third implantation mask 53 on the first region 101. Therefore, the well contact region 205 is exposed in the first region 101. On the other hand, the second region 102 is covered with the third implantation mask 53. Accordingly, the first region 101 and the second region 102 have different appearances.

Accordingly, a region containing the second region 102 can be used as an alignment pattern 73. The procedure of the appearance inspection step is the same as the procedure described with reference to FIG. 5 except that the alignment pattern 71 is replaced by the alignment pattern 73. Note that the appearance inspection step may be performed before the ion implantation from the first opening 153 is performed. Thereafter, the third implantation mask 53 is removed.

Figure 10:
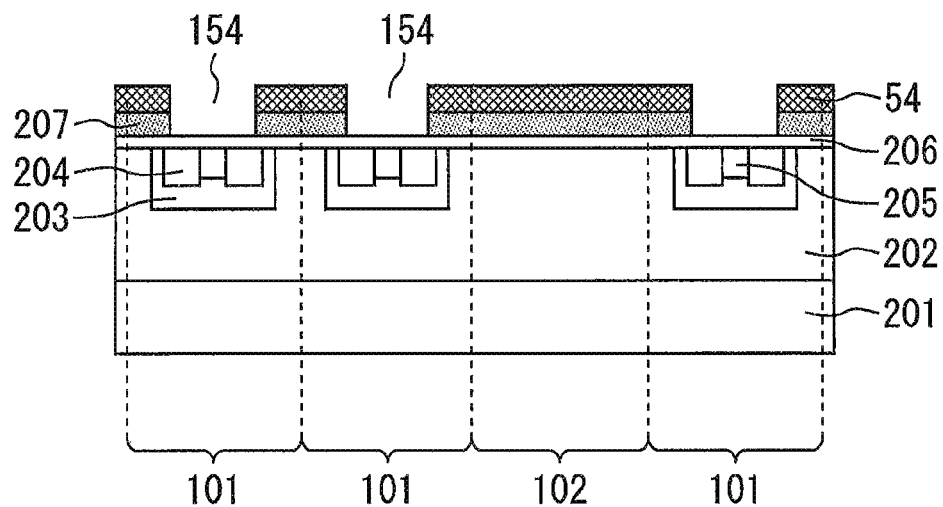
FIG. 10 is a cross-sectional view showing the method for manufacturing the semiconductor device according to the first embodiment.

Next, annealing is performed in an inert gas atmosphere such as argon gas by using a heat treatment apparatus. The annealing is performed at 1300° C. to 1900° C. for 30 seconds to 1 hour. Ion-implanted nitrogen and aluminum are activated by the annealing. Next, the surface of the drift layer 202 on which the wells 203, the sources 204 and the well contact regions 205 are formed is thermally oxidized. From the above step, a gate insulating film 206 shown in FIG. 10 is formed. The thickness of the gate insulating film 206 is appropriately adjusted.

Next, a gate electrode 207 is formed on the gate insulating film 206. The gate electrode 207 is a polycrystalline silicon film having conductivity. The gate electrode 207 is formed by a low pressure CVD method. Next, a gate electrode mask 54 is formed on the gate electrode 207. Next, a first opening 154 is formed in the gate electrode mask 54. The first opening 154 is formed by using a photoresist. The first opening 154 is formed on each of the first regions 101. In addition, the first opening 154 is formed inside a region where the source 204 is formed. In addition, the second region 102 is kept to be covered with the gate electrode mask 54. Here, the gate electrode mask 54 is an insulating layer. The step of forming the first opening 154 in the gate electrode mask 54 is referred to as the first opening step.

Next, the gate electrode 207 is etched by using the gate electrode mask 54 as an etching mask. From the above step, the gate electrode 207 is patterned. The gate electrode 207 is formed on the gate insulating film 206 across the adjacent first regions 101. Furthermore, the gate insulating film 206 is exposed at an upper portion of each source 204.

Figure 11:
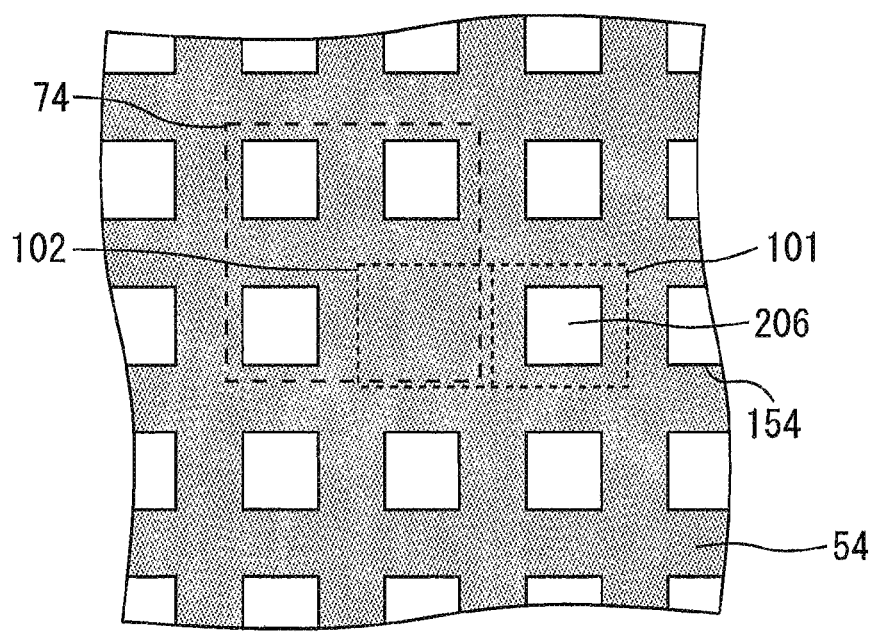
FIG. 11 is a plan view showing the method for manufacturing the semiconductor device according to the first embodiment.

Next, the appearance inspection step is carried out. FIG. 11 is a plan view of FIG. 10. The first opening 154 is provided in the gate electrode mask 54 on the first region 101. Therefore, the gate insulating film 206 is exposed in the first region 101. On the other hand, the second region 102 is covered with the gate electrode mask 54. Accordingly, the first region 101 and the second region 102 have different appearances.

Therefore, a region containing the second region 102 can be used as an alignment pattern 74. The procedure of the appearance inspection step is the same as the procedure described with reference to FIG. 5 except that the alignment pattern 71 is replaced by the alignment pattern 74. Note that the appearance inspection step may be performed before the gate electrode 207 is etched. Next, the gate electrode mask 54 is removed.

Figure 12:
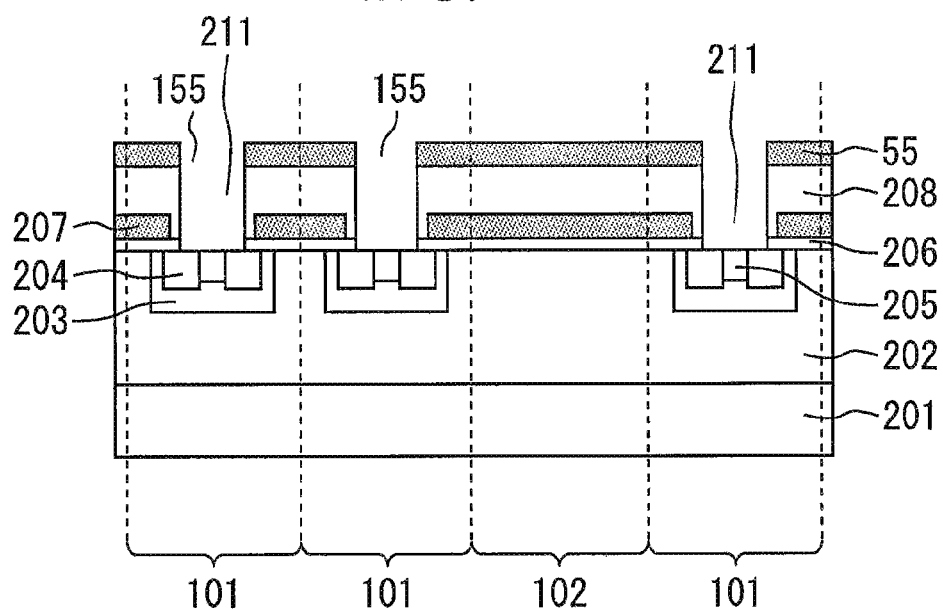
FIG. 12 is a cross-sectional view showing the method for manufacturing the semiconductor device according to the first embodiment.

Next, as shown in FIG. 12, the interlayer insulating film 208 is formed so as to cover the gate insulating film 206 and the gate electrode 207. The interlayer insulating film 208 is an oxide film. The interlayer insulating film 208 is formed by a CVD method. Next, an interlayer insulating film mask 55 is formed on the interlayer insulating film 208. Next, a first opening 155 is formed in the interlayer insulating film mask 55. The first opening 155 is formed by using a photoresist. The first opening 155 is formed on each of the first regions 101. In addition, at the upper portion of the source 204, the first opening 155 is formed inside of a region where the gate electrode 207 is formed. In addition, the second region 102 is kept to be covered with the gate electrode mask 54. Here, the interlayer insulating film mask 55 is an insulating layer. The step of forming the first opening 155 in the interlayer insulating film mask 55 is referred to as the first opening step.

Next, the gate insulating film 206 and the interlayer insulating film 208 are etched by using the interlayer insulating film mask 55 as an etching mask. As a result, in each of the first regions 101, the opening 211 is provided in the gate insulating film 206 and the interlayer insulating film 208. The opening 211 exposes the source 204 and the well contact region 205. In addition, the gate electrode 207 is kept to be covered with the interlayer insulating film 208. Furthermore, in the second region 102, the semiconductor layer 212 is kept to be covered with the gate insulating film 206.

Figure 13:
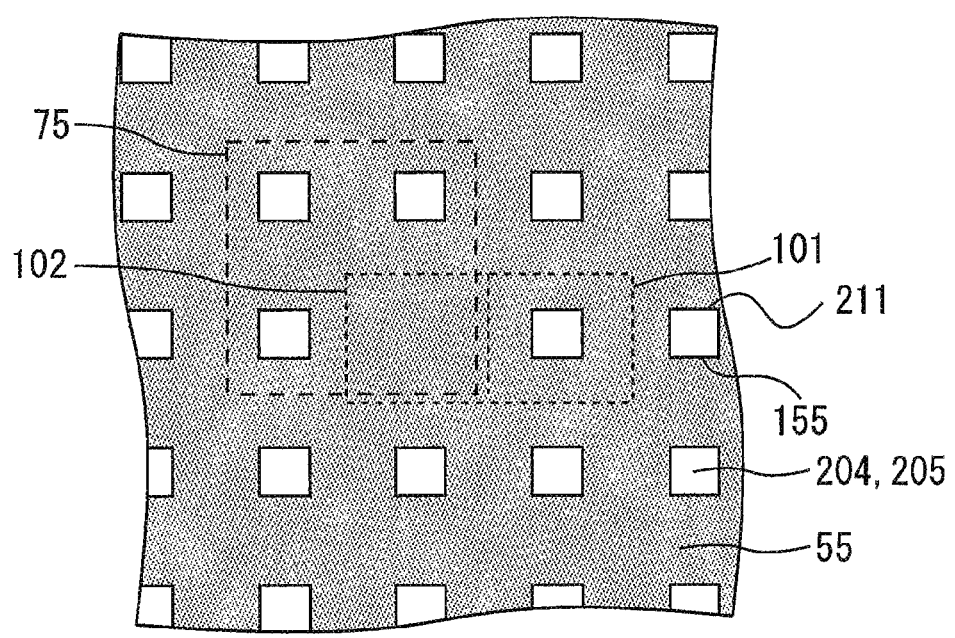
FIG. 13 is a plan view showing the method for manufacturing the semiconductor device according to the first embodiment.

Next, the appearance inspection step is carried out. FIG. 13 is a plan view of FIG. 12. The first opening 155 is provided in the interlayer insulating film mask 55 on the first region 101. Furthermore, in the first region 101, the source 204 and the well contact region 205 are exposed from the opening 211. On the other hand, the second region 102 is covered with the interlayer insulating film mask 55. Accordingly, the first region 101 and the second region 102 have different appearances.

Therefore, a region containing the second region 102 can be used as an alignment pattern 75. The procedure of the appearance inspection step is the same as the procedure described with reference to FIG. 5 except that the alignment pattern 71 is replaced by the alignment pattern 75. Note that the appearance inspection step may be carried out before the gate insulating film 206 and the interlayer insulating film 208 are etched. Next, the interlayer insulating film mask 55 is removed.

Figure 14:
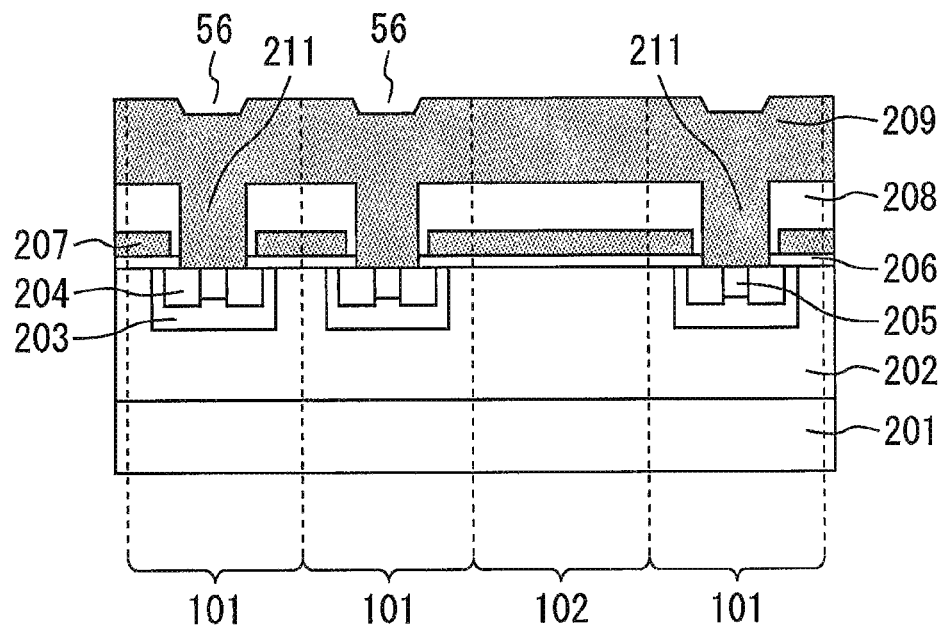
FIG. 14 is a cross-sectional view showing the method for manufacturing the semiconductor device according to the first embodiment.

Next, as shown in FIG. 14, the source electrode 209 is formed on the interlayer insulating film 208. The source electrode 209 fills the opening 211. At this time, the shape of the opening 211 is reflected to the upper surface of the source electrode 209. Therefore, a concave shape 56 is formed at the upper portion of the opening 211. Furthermore, in the opening 211, the source electrode 209 is in contact with the source 204 and the well contact region 205.

Figure 15:
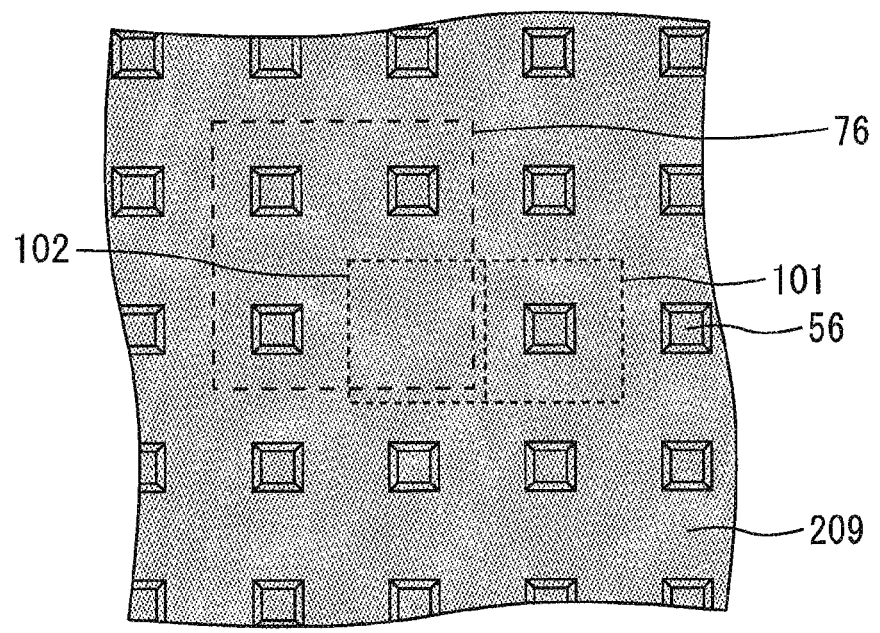
FIG. 15 is a plan view showing the method for manufacturing the semiconductor device according to the first embodiment.

Next, the appearance inspection step is carried out. FIG. 15 is a plan view of FIG. 14. In the first region 101, the concave shape 56 is formed on the upper surface of the source electrode 209. On the other hand, the upper surface of the source electrode 209 in the second region 102 is flat. Accordingly, the first region 101 and the second region 102 have different appearances. Therefore, a region containing the second region 102 can be used as an alignment pattern 76. The procedure of the appearance inspection step is the same as the procedure described with reference to FIG. 5 except that the alignment pattern 71 is replaced by the alignment pattern 76.

Next, the drain electrode 210 is formed on the hack surface of the substrate 201. Aluminum alloy can be used as a material for the source electrode 209 and the drain electrode 210. From the above steps, the semiconductor device 100 shown in FIG. 3 is completed.

In the present embodiment, one second region 102 is arranged in each unit region 16. The second region 102 is formed so as to have a different appearance from the first region 101 in the manufacturing process. Therefore, the second region 102 can be distinguished from the first region 101 in each unit region 16. Accordingly, the second region 102 can be used as an alignment pattern. In the present embodiment, each unit region 16 is provided with a characteristic alignment pattern. Therefore, accurate in-FOV alignment can be performed. As a result, an inspection image at an accurate position can be obtained. Therefore, defects can be accurately detected, and accurate appearance inspection can be performed.

Furthermore, in the present embodiment, it is possible to accurately cut out the inspection image from the captured image. Therefore, the region where the fields of view of the camera for imaging a chip overlap each other can be reduced. Accordingly, the number of FOVs can be reduced. Therefore, setting of the appearance inspection device is facilitated. Also, the inspection time can be shortened.

Furthermore, in the method for manufacturing the semiconductor device 100 according to the present embodiment, the appearances of the first region 101 and the second region 102 are different from each other in each step shown in FIGS. 4 to 15. Therefore, the appearance inspection step can be carried out after each of the steps while the region containing the second region 102 is set as the alignment patterns 71 to 76. In-wafer coordinates of defects and the number of detected defects are Obtained in the appearance inspection step. Accordingly, in the present embodiment, the in-wafer coordinates and the number of detected defects in the respective appearance inspection steps can be collated with one another. As a result, it is possible to know which manufacturing step causes defects and how many detects occur. Furthermore, by performing the in-FOV alignment, positional errors of detects can be reduced, so that the positions and the number of defects caused in each manufacturing step can be accurately collated.

Furthermore, in the present embodiment, the semiconductor layer 212 is formed of silicon carbide which is a wide bandgap semiconductor. Therefore, in the appearance inspection step, crystal defects of the semiconductor layer 212 can be detected in addition to process defects. Process defects and crystal defects coexist in defects detected in the appearance inspection step. Here, in the present embodiment, the appearance inspection step is carried out after each manufacturing step. By collating the results of the respective appearance inspection steps, it is possible to subtract the crystal defects from the detected defects. Accordingly, the process defects and the crystal defects can be identified.

Furthermore, there is a case Where an electron microscope is caused to read position information of a defect detected by appearance inspection, and the shape of the defect is observed with the electron microscope. At this time, when there is an error in the position of the defect, there is a case where the defect cannot be found with the electron microscope. On the other hand, in the present embodiment, the positional error of the detected defect can be reduced. Therefore, when defects are observed by using the electron microscope, the defects tend to be easily found.

Furthermore, when second regions 102 are provided in plural regions of each FOV, it may be difficult to identify a second region 102 used as an alignment pattern. In addition, main current under ON operation also decreases. Therefore, it is preferable that the number of the second regions 102 to be provided in each FOV is small. In the present embodiment, it is assumed that one second region 102 is provided for each FOV. Accordingly, the semiconductor device 100 includes one ineffective cell 12 per unit region 16.

Furthermore, when the second region 102 is arranged in the vicinity of an end portion of each FOV, the second region 102 may not appear in a captured image at the time of imaging. In order to prevent this, it is desirable that the second region 102 is arranged at the center portion of each FOV. Considering the size of the FOV of the appearance inspection device, the second regions 102 are arranged at intervals of 500 μm to 5000 μm. Therefore, the unit region 16 has a width of 500 μm to 5000 μm.

The semiconductor device 100 according to the present embodiment is provided with nine unit regions 16. The number of the unit regions 16 equipped in the semiconductor device 100 is not limited to the above number. Furthermore, in the present embodiment, the appearance inspection step is carried out six times. On the other hand, the number of times of executing the appearance inspection step may be increased or reduced as necessary. For example, the appearance inspection step may be set both before and after the ion implantation. Furthermore, the appearance inspection step may be carried out in a state where the semiconductor device 100 is completed. In this case, the in-FOV alignment is performed by using the alignment pattern 14 shown in FIG. 2.

In the present embodiment, the semiconductor layer 212 is formed of silicon carbide. Here, the semiconductor layer 212 may be any material insofar as the semiconductor layer 212 is a wide bandgap semiconductor. The semiconductor layer 212 may be formed of, for example, a gallium-nitride-based material or diamond. In addition, the combination of n-type and p-type of layers included in the semiconductor layer 212 may be reversed. Furthermore, in the present embodiment, the effective cell 11 is assumed to be a vertical MOSFET, but it may be other elements than the vertical MOSFET. The effective cell 11 may be any element insofar as a channel is formed in the element, for example, an IGBT may be used.

Figure 16:
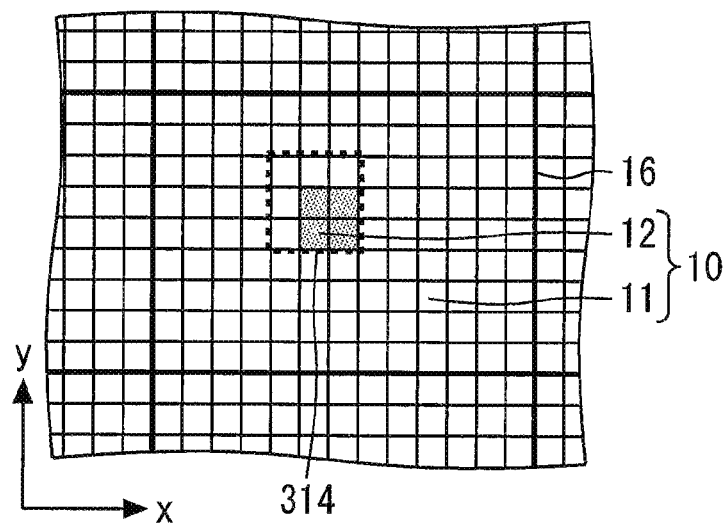
FIG. 16 is a plan view of a semiconductor device according to a modification of the first embodiment.

FIG. 16 is a plan view of a semiconductor device according to a first modification of the first embodiment. The semiconductor device 100 according to the first embodiment includes one ineffective cell 12 in each unit region 16. On the other hand, a semiconductor device 300 according to the first modification includes plural adjacent ineffective cells 12 in each unit region 16. In the semiconductor device 300, plural adjacent ineffective cells 12 are formed in one second region 102.

In the semiconductor device 300, each unit region 16 includes four ineffective cells 12. The four ineffective cells 12 are arranged adjacently to form a square. In the semiconductor device 300, an alignment pattern 314 contains nine unit cells 10. In addition, the alignment pattern 314 is square and contains the ineffective cells 12 at a lower right portion thereof. In the semiconductor device 300, each unit region 16 is provided with four ineffective cells 12. On the other hand, the number of ineffective cells 12 contained in the unit region 16 may be any number other than the above number. Furthermore, in the semiconductor device 300, the four ineffective cells 12 are arranged so as to form a square. The arrangement manner of the ineffective cells 12 may be any other arrangement manner than the above arrangement manner insofar as the ineffective cells 12 are arranged adjacently.

Figure 17:
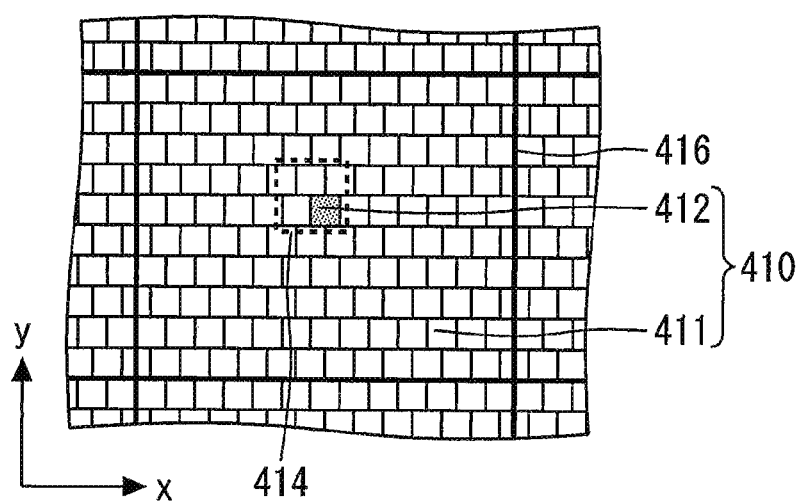
FIG. 17 is a plan view of a semiconductor device according to a modification of the first embodiment.

FIG. 17 is a plan view of a semiconductor device according to a second modification of the first embodiment. In a semiconductor device 400 according to the second modification, unit cells 410 are placed in a staggered arrangement on an x-y plane. The unit cells 410 include effective cells 411 and ineffective cells 412. The semiconductor device 400 is divided into plural unit regions 416. Each unit region 416 includes plural effective cells 411 and an ineffective cell 412. Furthermore, the alignment pattern is a region surrounded by a broken line 414.

Figure 18:
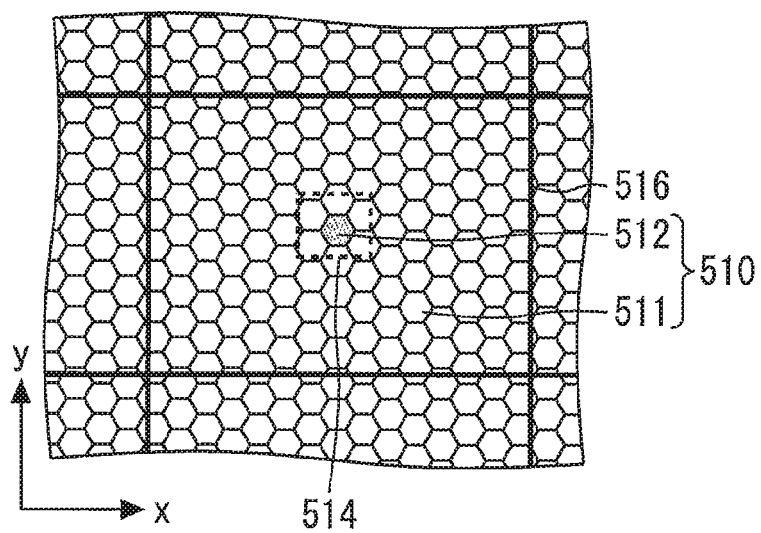
FIG. 18 is a plan view of a semiconductor device according to a modification of the first embodiment.

FIG. 18 is a plan view of a semiconductor device according to a third modification of the first embodiment. In a semiconductor device 500 according to the third modification, unit cells 510 are arranged on an x-y plane. The unit cells 510 include effective cells 511 and ineffective cells 512. The unit cell 510 is hexagonal. The semiconductor device 500 is divided into plural unit regions 516. Each unit region 516 includes plural effective cells 511 and an ineffective cell 512. Furthermore, the alignment pattern is a region surrounded by a broken line 514.

Figure 19:
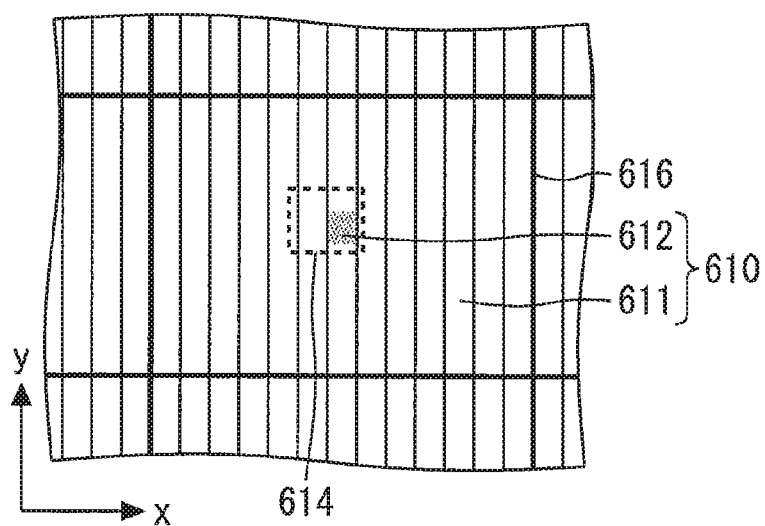
FIG. 19 is a plan view of a semiconductor device according to a modification of the first embodiment.

FIG. 19 is a plan view of a semiconductor device according to a fourth modification of the first embodiment. In a semiconductor device 600 according to the fourth modified example, unit cells 610 are arranged on an x-y plane. The unit cells 610 include effective cells 611 and ineffective cells 612. The effective cell 611 has a stripe shape. The ineffective cell 612 is rectangular. The ineffective cell 612 may be a square. The semiconductor device 600 is divided into plural unit regions 616. Each unit region 616 has plural effective cells 611 and an ineffective cell 612. Furthermore, the alignment pattern is a region surrounded by a broken line 614.

These modifications can be applied, as appropriate, to a semiconductor device and a method for manufacturing the same according to the following embodiments. Note that the semiconductor device and the method for manufacturing the same according to the following embodiments are similar to those of the first embodiment in many respects, and thus differences between the semiconductor device and the method for manufacturing the same according to the following embodiments and those of the first embodiment will be mainly described below.

Second Embodiment

Figure 20:
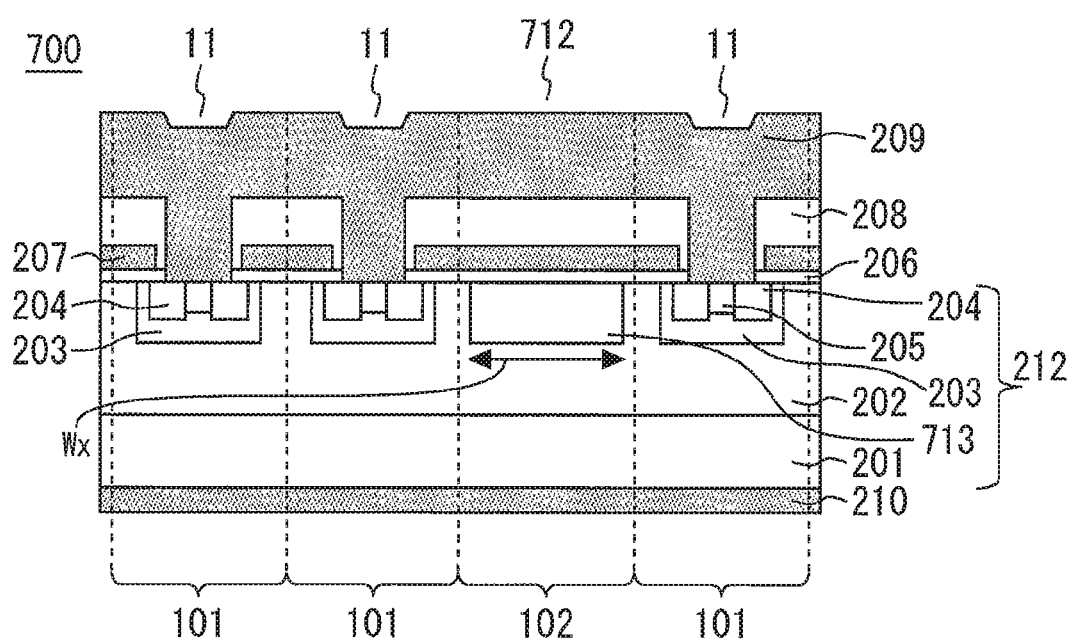
FIG. 20 is a cross-sectional view of a semiconductor device according to a second embodiment.

FIG. 20 is a cross-sectional view of a semiconductor device according to a second embodiment. A semiconductor device 700 according to the present embodiment is the same as the semiconductor device 100 except for the structure of an ineffective cell 712. The semiconductor device 700 includes ineffective cells 712. The ineffective cell 712 has a p-type well 713 in a semiconductor layer 212. The well 713 is formed on the upper surface side of a drift layer 202 in the ineffective cell 712. The well 713 contains aluminum as p-type impurities. The well 713 has a width Wx in the x direction and a width Wy in the y direction. Wx and Wy are larger than the widths of the well 203 in the same directions.

Figure 21:
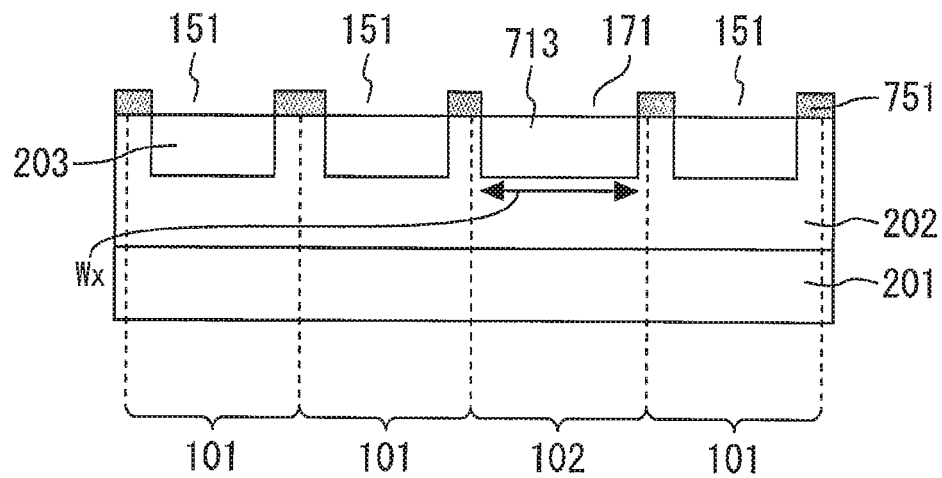
FIG. 21 is a cross-sectional view showing the method for manufacturing the semiconductor device according to the second embodiment.

Next, a method for manufacturing the semiconductor device 700 will be described. The method for manufacturing the semiconductor device 700 is the same as that of the first embodiment except for the step of forming the well 203. FIG. 21 is a cross-sectional view showing the method for manufacturing the semiconductor device according to the second embodiment. In the method for manufacturing the semiconductor device 700, after the drift layer 202 is formed, a first implantation mask 751 is formed on the drift layer 202. Next, the first opening 151 and a second opening 171 are formed in the first implantation mask 751. The first opening 151 and the second opening 171 are formed by using a photoresist.

The first opening 151 is formed on each of the first regions 101. The second opening 171 is formed on the second region 102. Here, the second opening 171 is formed to be wider than the first opening 151. In addition, the first opening 151 and the second opening 171 are formed so as to expose the drift layer 202. Here, the first implantation mask 751 corresponds to an insulating layer. The step of forming the first opening 151 and the second opening 171 in the first implantation mask 751 corresponds to a second opening step.

Next, aluminum ions as p-type impurities are implanted into the drift layer 202 from the first opening 151 and the second opening 171. At this time, the implantation depth of the aluminum ions is set in the range from 0.5 to 3 μm which does not exceed the thickness of the drift layer 202. The impurity concentration of the ion-implanted aluminum is set in the range from $1\times10^{17}$ to $1\times10^{15}$ cm$^{-3}$ which is higher than the n-type impurity concentration of the drift layer 202. Front the above steps, the well 203 and the well 713 are formed.

Figure 22:
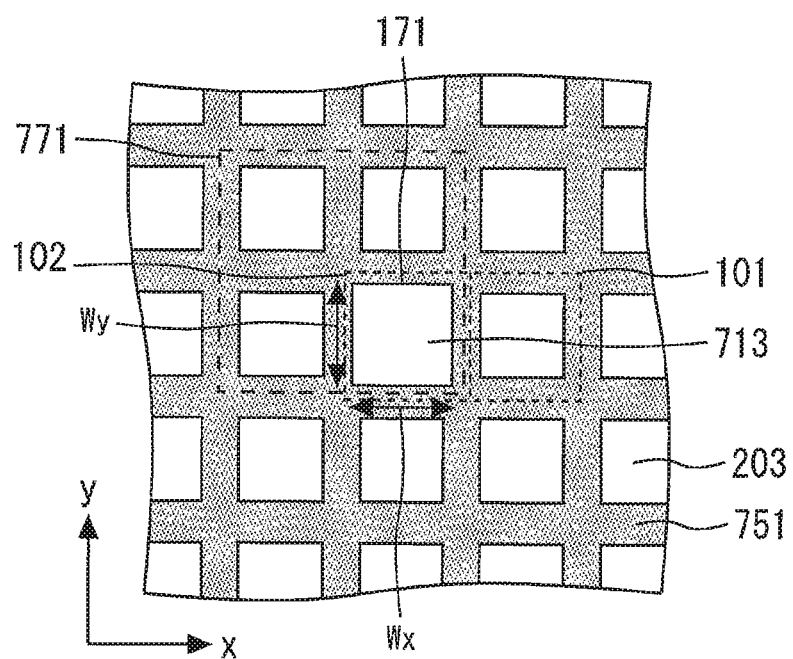
FIG. 22 is a plan view showing the method for manufacturing the semiconductor device according to the second embodiment.

Next, the appearance inspection step is carried out. FIG. 22 is a plan view of FIG. 21. The first opening 151 is provided in the first implantation mask 751 on the first region 101. The second opening 171 is provided in the first implantation mask 751 on the second region 102. A width $W_x$ in the x direction of the second opening 171 and a width $W_y$ in the y direction of the second opening 171 are larger than the widths of the first opening 151 in the same directions. Accordingly, the first region 101 and the second region 102 have different appearances.

Accordingly, a region containing the second region 102 can be used as an alignment pattern 771. The procedure of the appearance inspection step is the same as the procedure described in the first embodiment except that the alignment pattern 71 is replaced by the alignment pattern 771. Note that the appearance inspection step may be carried out before ion implantation is performed from the first opening 151 and the second opening 171. Thereafter, the first implantation mask 751 is removed.

In the present embodiment, the well 713 of the ineffective cell 712 is formed to be larger than the well 203 of the effective cell 11. Therefore, a region containing the second region 102 can be used as the alignment pattern 771. Also, when MOSFET as the effective cell 11 is under an OFF-state, a high voltage of several hundreds to several thousands of volts may occur in the drain electrode 210. When the ineffective cell has no well, high electric field may occur in the gate insulating film of the ineffective cell. In the present embodiment, the ineffective cell 712 has the well 713. At this time, the electric field occurring in the gate insulating film 206 can be relaxed. Accordingly, the reliability of the semiconductor device 700 can be enhanced.

Third Embodiment

Figure 23:
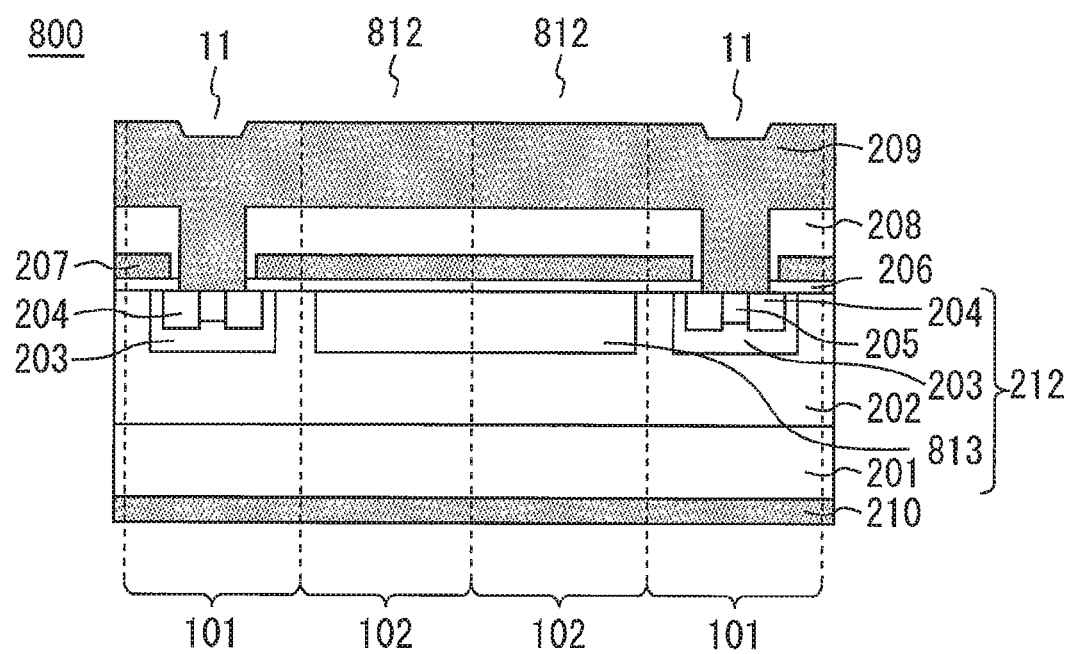
FIG. 23 is a cross-sectional view of a semiconductor device according to a third embodiment.

FIG. 23 is a cross-sectional view of a semiconductor device according to a third embodiment. A semiconductor device 800 according to the present embodiment is the same as the semiconductor device 100 except for the structure of an ineffective cell 812. The semiconductor device 800 includes two adjacent ineffective cells 812 in the unit region 16. The adjacent ineffective cells 812 have a p-type well 813 in the semiconductor layer 212. The well 813 is provided across the two adjacent ineffective cells 812. That is, the adjacent ineffective cells 812 have a common well 813. The well 813 is formed on the upper surface side of the drift layer 202. The well 813 contains aluminum as p-type impurities.

Figure 24:
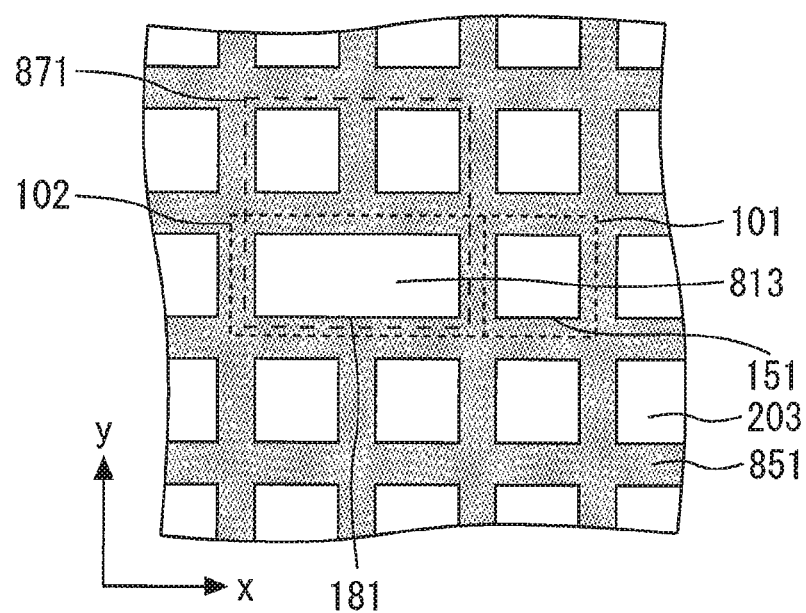
FIG. 24 is a plan view showing the method for manufacturing the semiconductor device according to the third embodiment.

Next, a method for manufacturing the semiconductor device 800 will be described. FIG. 24 is a plan view showing the method for manufacturing the semiconductor device according to the third embodiment. The method for manufacturing the semiconductor device 800 is the same as that of the first embodiment except for the step of forming the well 203. In the method for manufacturing the semiconductor device 800, after the drift layer 202 is formed, a first implantation mask 851 is formed on the drift layer 202. Next, the first opening 151 and a second opening 181 are formed in the first implantation mask 851. The first opening 151 and the second opening 181 are formed using a photoresist.

The first opening 151 is formed on each of the first regions 101. The second opening 181 is formed on the second region 102. Here, in the present embodiment, the second region 102 is a region where two adjacent ineffective cells 812 are formed. Accordingly, the second region 102 has a width corresponding to two unit cells. The second opening 181 is formed on the second region 102 to be wider than the first opening 151. In addition, the first opening 151 and the second opening 181 are formed so as to expose the drift layer 202. Here, the first implantation mask 851 corresponds to an insulating layer. The step of forming the first opening 151 and the second opening 181 in the first implantation mask 851 corresponds to the second opening step.

Next, aluminum ions as p-type impurities are implanted into the drift layer 202 from the first opening 151 and the second opening 181. At this time, the implantation depth of the aluminum ions is set in the range from 0.5 to 3 μm which does not exceed the thickness of the drift layer 202. The impurity concentration of the ion-implanted aluminum is set in the range from $1 \times 10^{17}$ to $1 \times 10^{19}$ cm$^{-3}$ which is higher than the type impurity concentration of the drift layer 202. From the above step, the well 203 and the well 813 are formed.

Next, the appearance inspection step is carried out. The first opening 151 is provided in the first implantation mask 851 on the first region 101. The second opening 181 is provided on the second region 102. Since the second opening 181 is provided across the region where the two ineffective cells 812 are formed, the second opening 181 is wider than the first opening 151. Accordingly, the first region 101 and the second region 102 have different appearances.

Accordingly, a region containing the second region 102 can be used as an alignment pattern 871. The procedure of the appearance inspection step is the same as the procedure described in the first embodiment except that the alignment pattern 71 is replaced by the alignment pattern 871. Note that the appearance inspection step may be carried out before the ion implantation is performed from the first opening 151 and the second opening 181. Thereafter, the first implantation mask 851 is removed.

In the present embodiment, the well 813 of the ineffective cell 812 is formed to be larger than the well 203 of the effective cell 11. Therefore, a region containing the second region 102 can be used as the alignment pattern 871. Furthermore, the semiconductor device 800 includes the well 813 in the ineffective cell 812. Accordingly, as in the case of the second embodiment, electric field occurring in the gate insulating film 206 can be relaxed. Therefore, the reliability of the semiconductor device 800 can be enhanced. Note that the technical features described in the above embodiments may be combined as appropriate.

REFERENCE SIGNS LIST 100,200,300,400,500,600,700,800 semiconductor device, 101 first region, 102 second region, 11,411,511,611 effective cell, 12,412,512,612,712,812 ineffective cell, 16 unit region, 71,72,73,74,75,76,771,871 alignment pattern, 151,152,154,211 first opening, 171,181 second opening, 203,713,813 well

The invention claimed is:

1. A method for manufacturing a semiconductor device comprising:
    a manufacturing step of forming a plurality of unit regions each having a plurality of first regions serving as effective cells in which main current flows, and a second region that has an appearance different from that of the first regions and serves as an ineffective cell in which no main current flows, and
    an appearance inspection step including a step of imaging the unit region to obtain a captured image, a step of cutting out an inspection image from the captured image based on a position of an alignment pattern containing the second region, and a step of comparing the inspection image with a reference image.

2. The method for manufacturing a semiconductor device according to claim 1, wherein the manufacturing step comprises:
    a step of providing an insulating layer on the unit region; and
    a first opening step of forming a first opening in the insulating layer on each of the plurality of first regions and keeping a state where the second region is covered with the insulating layer.

3. The method for manufacturing a semiconductor device according to claim 1, wherein
the manufacturing step comprises:
    a step of providing an insulating layer on the unit region; and
    a second opening step of forming a first opening in the insulating layer on each of the plurality of first regions, and forming a second opening wider than the first opening in the insulating layer on the second region.

4. The method for manufacturing a semiconductor device according to claim 1, wherein
the second region is arranged at a center portion of the unit region.

5. The method for manufacturing a semiconductor device according to claim 1, wherein
the plurality of first regions and the second region have wide bandgap semiconductors.

6. The method for manufacturing a semiconductor device according to claim 5, wherein the wide bandgap semiconductors are formed of silicon carbide, gallium-nitride-based material or diamond.

7. A semiconductor device comprising:
    a plurality of unit regions each having a plurality of effective cells in which main current flows, and an ineffective cell that has an appearance different from that of the effective cells and in which no main current flows, wherein
    the unit region has a plurality of adjacent ineffective cells, each adjacent ineffective cell of the plurality of adjacent ineffective cells sharing at least one side with another of the plurality of adjacent ineffective cells, and
    the plurality of adjacent ineffective cells form an alignment pattern.

8. The semiconductor device according to claim 7, wherein
the ineffective cell has a well.

9. The semiconductor device according to claim 8, wherein
the well of the ineffective cell is wider than wells of the plurality of effective cells.

10. The semiconductor device according to claim 7, wherein
the plurality of effective cells and the ineffective cell are placed in a staggered arrangement.

11. The semiconductor device according to claim 7, wherein
the plurality of effective cells and the ineffective cell are hexagonal.

12. The semiconductor device according to claim 7, wherein
the plurality of effective cells have stripe shapes; and
the ineffective cell is rectangular.

13. The semiconductor device according to claim 7, wherein
the plurality of effective cells and the ineffective cell have wide bandgap semiconductors.

14. The semiconductor device according to claim 13, wherein
the wide bandgap semiconductors are formed of silicon carbide, gallium-nitride-based material or diamond.

* * * * *